United States Patent
Torigoe et al.

(10) Patent No.: US 11,121,003 B2
(45) Date of Patent: Sep. 14, 2021

(54) METHOD OF PREDICTING THERMAL DONOR FORMATION BEHAVIOR IN SILICON WAFER, METHOD OF EVALUATING SILICON WAFER, AND METHOD OF PRODUCING SILICON WAFER

(71) Applicant: SUMCO Corporation, Tokyo (JP)

(72) Inventors: Kazuhisa Torigoe, Tokyo (JP); Shigeru Umeno, Tokyo (JP); Toshiaki Ono, Tokyo (JP)

(73) Assignee: SUMCO Corporation, Tokyo (JP)

( * ) Notice: Subject to any disclaimer, the term of this patent is extended or adjusted under 35 U.S.C. 154(b) by 91 days.

(21) Appl. No.: 16/621,219

(22) PCT Filed: Jun. 12, 2018

(86) PCT No.: PCT/JP2018/022454
§ 371 (c)(1),
(2) Date: Dec. 10, 2019

(87) PCT Pub. No.: WO2018/235678
PCT Pub. Date: Dec. 27, 2018

(65) Prior Publication Data
US 2020/0105542 A1    Apr. 2, 2020

(30) Foreign Application Priority Data
Jun. 23, 2017 (JP) .............................. JP2017-123626

(51) Int. Cl.
*C30B 33/02* (2006.01)
*H01L 21/322* (2006.01)
*C30B 29/06* (2006.01)

(52) U.S. Cl.
CPC .......... *H01L 21/3225* (2013.01); *C30B 29/06* (2013.01); *C30B 33/02* (2013.01)

(58) Field of Classification Search
CPC ................................ C30B 29/06; C30B 33/02
See application file for complete search history.

(56) References Cited

U.S. PATENT DOCUMENTS

| | | | |
|---|---|---|---|
| 7,521,382 B2 * | 4/2009 | Falster | C30B 29/06 257/E21.328 |
| 2005/0158969 A1 * | 7/2005 | Binns | H01L 21/3226 438/471 |

(Continued)

FOREIGN PATENT DOCUMENTS

| | | |
|---|---|---|
| JP | H11147789 A1 | 6/1999 |
| JP | 2013119486 A | 6/2013 |

(Continued)

OTHER PUBLICATIONS

Kamiura et al., "A New Family of Thermal Donors Generated around 450° C. in Phosphorus-Doped Czochralski Silicon," J. Appl. Phys. 65(2):600-605, Jan. 1989.

(Continued)

*Primary Examiner* — Robert M Kunemund
(74) *Attorney, Agent, or Firm* — Christensen O'Connor Johnson Kindness

(57) ABSTRACT

Provided is a method of accurately predicting the thermal donor formation behavior in a silicon wafer, a method of evaluating a silicon wafer using the prediction method, and a method of producing a silicon wafer using the evaluation method. The method of predicting the formation behavior of thermal donors, includes: a first step of setting an initial oxygen concentration condition before performing heat treatment on the silicon wafer for reaction rate equations based on both a bond-dissociation model of oxygen clusters associated with the diffusion of interstitial oxygen and a bonding model of oxygen clusters associated with the diffusion of oxygen dimers; a second step of calculating the formation rate of oxygen clusters formed through the heat (Continued)

treatment using the reaction rate equations; and a third step of calculating the formation rate of thermal donors formed through the heat treatment based on the formation rate of the oxygen clusters.

7 Claims, 7 Drawing Sheets

(56) References Cited

U.S. PATENT DOCUMENTS

| | | | | |
|---|---|---|---|---|
| 2005/0250349 | A1* | 11/2005 | Sadamitsu | C30B 29/06 |
| | | | | 438/800 |
| 2006/0263967 | A1* | 11/2006 | Falster | H01L 21/3225 |
| | | | | 438/226 |
| 2009/0210166 | A1* | 8/2009 | Nakamura | H01L 21/3225 |
| | | | | 702/23 |

FOREIGN PATENT DOCUMENTS

| | | |
|---|---|---|
| JP | 2013536942 A | 9/2013 |
| JP | 2016500641 A | 1/2016 |
| WO | 2005071144 A | 8/2005 |

OTHER PUBLICATIONS

McQuaid, S.A., et al., "Oxygen Loss During Thermal Donor Formation in Czochralski Silicon New Insights Into Oxygen Diffusion Mechanisms," J. Appl. Phys. 77(4):1427-1442, Feb. 1995.
Notification of Reason for Refusal dated Mar. 19, 2021, issued in corresponding Korean Application No. 10-2019-7034339, filed Nov. 21, 2019, 3 pages.
PCT International Preliminary Report on Patentability, PCT Rule 44bis, dated Dec. 24, 2019, issued in corresponding International Application No. PCT/JP2018/022454, filed Jun. 12, 2018, 9 pages.

* cited by examiner

METHOD OF PREDICTING THERMAL DONOR FORMATION BEHAVIOR IN SILICON WAFER, METHOD OF EVALUATING SILICON WAFER, AND METHOD OF PRODUCING SILICON WAFER

TECHNICAL FIELD

This disclosure relates to a method of predicting the formation behavior of thermal donors in a silicon wafer, a method of evaluating a silicon wafer, and a method of producing a silicon wafer.

BACKGROUND

Silicon wafers are widely used as semiconductor substrates used to manufacture various kinds of semiconductor devices such as radio frequency (RF) devices, MOS devices, DRAMs, and NAND-type flash memories. In a so-called device process by which a semiconductor device is fabricated using a silicon wafer, a variety of heat treatment processes such as oxidation treatment, nitriding treatment, plasma etching, and the impurity diffusion process are performed.

Here, oxygen in a silicon wafer is usually electrically neutral. However, it is known that several to several tens of oxygen atoms aggregate to form each oxygen cluster in a silicon crystal, when the silicon wafer is subjected to heat treatment at a relatively low temperature of approximately less than 600° C. (hereinafter referred to as low-temperature heat treatment). These oxygen clusters are donors that release electrons and are called thermal donors. When thermal donors are subjected to high-temperature heat treatment at approximately 650° C. or more, they become electrically neutral; such a high-temperature heat treatment is called donor killer heat treatment (donor killer annealing).

The carrier concentration of a silicon wafer changes due to the formation of thermal donors; accordingly, the resistivity of the silicon wafer changes during low-temperature heat treatment in a device process, and the conductivity type may be reversed. For example, when a silicon wafer is a high resistance p-type wafer, it may turn into an n-type wafer depending on the amount of the thermal donors formed.

Such a change in the resistivity of a silicon wafer may greatly affect the device characteristics of a semiconductor device. Previously, the mechanism of the formation of thermal donors after performing low-temperature heat treatment on a silicon single crystal has been studied, and a variety of methods of accurately predicting the thermal donor concentration of a silicon wafer have been studied.

In S. A. McQuaid et al., "Oxygen loss during thermal donor formation in Czochralski silicon: New insights into oxygen diffusion mechanisms"; Journal of Applied Physics; Feb. 15, 1995; Vol. 77, No. 4, pp. 1427-1442 (NPL 1), a model for the formation of oxygen clusters during the thermal donor formation by low-temperature heat treatment performed on a CZ silicon single crystal is studied. Further, Y. Kamiura et al., "A new family of thermal donors generated around 450° C. in phosphorus-doped Czochralski silicon"; Journal of Applied Physics; Jan. 15, 1989; Vol. 65, No. 2, pp. 600-605 (NPL 2) discloses that when low-temperature heat treatment is continued for a long time after thermal donors are formed in a silicon single crystal, the thermal donors are annihilated.

Still further, JP 2013-119486 A (PTL 1) proposes Formula A below expressing the amount of carriers formed due to oxygen donors formed when low-temperature heat treatment is performed on a silicon single crystal $\Delta[C]$ using the oxygen concentration of the silicon single crystal [Oi], the baking temperature T, the heat treatment time t, the oxygen diffusion coefficient D(T) at the temperature T.

$$\Delta[C] = \alpha[Oi]^5 \times \exp(-\beta \cdot D(T) \cdot [Oi] \cdot t) \quad (A)$$

(wherein $\alpha$ and $\beta$ are constants)

According to PTL 1, the formation of carriers in a silicon single crystal can be evaluated generally and more accurately compared with conventional techniques.

CITATION LIST

Patent Literature

PTL 1: JP 2013-119486 A
NPL 1: S. A. McQuaid et al, "Oxygen loss during thermal donor formation in Czochralski silicon: New insights into oxygen diffusion mechanisms"; Journal of Applied Physics; Feb. 15, 1995; Vol. 77, No. 4, pp. 1427-1442
NPL 2: Y. Kamiura et al., "A new family of thermal donors generated around 450° C. in phosphorus-doped Czochralski silicon"; Journal of Applied Physics; Jan. 15, 1989; Vol. 65, No. 2, pp. 600-605

SUMMARY

Technical Problem

As a result of reviewing Formula A mentioned in PTL 1, the inventors of this disclosure first conceived of Formula B below by improving Formula A.

$$\Delta[C] = \alpha_1[Oi]^5 \times \{1 - \exp(-\beta_1 \cdot D(T) \cdot [Oi] \cdot t)\} \quad (B)$$

(wherein $\alpha_1$ and $\beta_1$ are constants and are different from $\alpha$ and $\beta$ in Formula A, respectively)

Although Formula B is a heuristic formula, the inventors expected that using this formula, the concentration of thermal donors formed in low-temperature heat treatment could be accurately calculated, and the behavior of the thermal donors formed in a silicon wafer could be predicted.

Accordingly, they verified the prediction accuracy of Formula B using the experimental values disclosed in NPL 2 mentioned above. Specifically, the heat treatment temperature T was 450 [° C.], the oxygen concentration of a silicon single crystal [Oi] was $13 \times 10^{17}$ [cm$^{-3}$], and as D(T), the diffusion coefficient D(T) disclosed in PTL 1: D(T)=0.13× exp(−2.53 [eV]/k$_B$T) [cm²/s] was used. Further, k$_B$ was the Boltzmann constant. Meanwhile, $\alpha_1$ and $\beta_1$ were determined by optimization using fitting with the experimental values disclosed in NPL 2. The results of calculating the thermal donor concentration from Formula B is given in FIG. 1 with the experimental values in NPL 2.

As depicted in the graph of FIG. 1, low-temperature heat treatment within several tens of hours conceivably allows for the prediction of the thermal donor concentration (the amount of thermal donors formed) with relatively high reproducibility using Formula B. However, in the case of using Formula B, if low-temperature heat treatment is performed for more than 100 hours, the annihilation of thermal donors due to heat treatment for a long time that is reported in NPL 2 cannot be predicted.

Further, the inventors also verified the prediction accuracy of Formula B for low-temperature heat treatment for a short time within several tens of hours. To evaluate the behavior of thermal donors being formed in a short time, the following experiment was performed first to experimentally confirm the thermal donor formation rate.

First, a (100) p-type silicon single crystal ingot having a diameter of 300 mm was grown using the CZ process. The grown ingot was sliced to prepare silicon wafer samples meeting the condition of an oxygen concentration of $11 \times 10^{17}$ [cm$^{-3}$], Each sample was subjected to heat treatment in a nitrogen atmosphere at 700° C. for 15 min to perform donor killer heat treatment. After that, each sample was subjected to low-temperature heat treatment in a nitrogen atmosphere at 450° C. to form thermal donors.

Each sample was subjected to the measurement of the specific resistance after low-temperature heat treatment using a testing method using a four-point probe array according to JIS H 0602 (1995), and the carrier concentration was found from Irvin curves based on the specific resistance measured. Subsequently, the amount of the thermal donors formed was determined using the carrier concentration. Further, the thermal donor formation rate was found based on the amount of the formed thermal donors determined and the heat treatment time for which the low-temperature heat treatment was performed. The relationship between the thermal donor formation rate calculated according to Formula B and the experimental values mentioned above is depicted in the graph of FIG. 2.

In the light of FIG. 1, in the case of performing low-temperature heat treatment for a short time, the thermal donor formation behavior was once thought to be reproduced relatively accurately according to Formula. B. However, in reality, as illustrated in FIG. 2, since the rate of formation of thermal donors reaches a peak in approximately 10 hours after the start of low-temperature heat treatment, the thermal donor formation rate in low-temperature heat treatment for a shorter time cannot be reproduced even when using Formula. B.

Thus, a prediction formula based on heuristics cannot accurately predict both the thermal donor formation behavior in a short time of less than 50 hours, particularly within several tens of hours and the thermal donor formation behavior in a long time of more than several hundreds of hours.

In recent years, device manufactures repeat low-temperature heat treatment in stacking processes for 3D NAND-type flash memories or DRAMs. Accordingly, the thermal donor formation behavior in a silicon wafer having been subjected to low-temperature heat treatment for a long time needs to be accurately predicted. On the other hand, when a device process includes high-temperature heat treatment corresponding to donor killer heat treatment in the middle of low-temperature heat treatment, thermal donors are once annihilated; therefore, the thermal donor formation behavior in low-temperature heat treatment for a short time also needs to be accurately predicted.

It could therefore be helpful to provide a method of accurately predicting the thermal donor formation behavior in a silicon wafer that can be applied to both short-time heat treatment and long-time heat treatment, and it could also be helpful to provide a method of evaluating a silicon wafer using the prediction method, and a method of producing a silicon wafer using the evaluation method.

Solution to Problem

We diligently studied to solve the above problems. Specifically, we studied chemical kinetics based on a bond-dissociation model of oxygen clusters associated with diffusion of interstitial oxygen $O_i$ and a bonding model of oxygen clusters associated with diffusion of oxygen dimers $O_2$. Thus, we found that the rate of the thermal donor formation can be more accurately predicted in the cases of both short-time heat treatment and long-time heat treatment by calculating the oxygen cluster formation rate using reaction rate equations based on the two models. This disclosure completed based on the above findings primarily includes the following features.

<1> A method of predicting a formation behavior of thermal donors formed due to oxygen generated when heat treatment is performed on a silicon wafer, comprising:

a first step of setting an initial oxygen concentration condition before performing the heat treatment on the silicon wafer for reaction rate equations based on both a bond-dissociation model of oxygen clusters associated with diffusion of interstitial oxygen and a bonding model of oxygen clusters associated with diffusion of oxygen dimers;

a second step of calculating a formation rate of oxygen clusters formed through the heat treatment using the reaction rate equations; and a third step of calculating a formation rate of thermal donors formed through the heat treatment based on the formation rate of the oxygen clusters, wherein the reaction rate equations are the following formulae (1) to (4):

$$\frac{d[O_1]}{dt} = -2k_{f1}[O_1]^2 - k_{f1}[O_1]\left(\sum_{n=2}^{M-1}[O_n]\right) + \qquad (1)$$
$$2k_{b2}[O_2] - k_{f2}[O_2][O_1] + \sum_{n=3}^{M-1} k_{bn}[O_n]$$

$$\frac{d[O_2]}{dt} = k_{f1}[O_1]^2 - k_{f1}[O_2][O_1] - k_{b2}[O_2] + \qquad (2)$$
$$k_{b3}[O_3] - k_{f2}[O_2]\left([O_1] + 2[O_2] + \sum_{n=3}^{M-2}[O_n]\right)$$

$$\frac{d[O_n]}{dt} = k_{f1}[O_1][O_{n-1}] - k_{f1}[O_1][O_n] + \qquad (3)$$
$$k_{f2}[O_2]([O_{n-2}] - [O_n]) - k_{bn}[O_n] + k_{bn+1}[O_{n+1}]$$

$$\frac{d[O_M]}{dt} = k_{f1}[O_1][O_{M-1}] - k_{f1}[O_1][O_M] + k_{f2}[O_2][O_{M-2}] - k_{bM}[O_M] \qquad (4)$$

where t represents a time; M is a maximum number of oxygen clusters that become donors; $[O_1]$ and $[O_2]$ represent concentrations of interstitial oxygen $O_i$ and oxygen cluster $O_n$, respectively; $k_{f1}$ is a combination rate coefficient of interstitial oxygen bound to either other interstitial oxygen $O_i$ or oxygen clusters, depending on a heat treatment temperature; $k_{f2}$ is a combination rate coefficient of oxygen dimers bound to either other interstitial oxygen $O_i$ or oxygen clusters, depending on the heat treatment temperature; $k_{b2}$ is a dissociation rate constant of interstitial oxygen being dissociated from oxygen dimers to form two interstitial oxygen atoms; $k_{bn}$ is a dissociation rate constant of interstitial oxygen being dissociated from oxygen clusters of a cluster number n; n satisfies 3≤n≤M−1 in the above formula (3); and the formula (3) represents (M−3) simultaneous equations expressing change of $[O_n]$ where 3≤n≤M−1 with time, and in the third step, the thermal donor formation rate is calculated using the following formula (5) in which a minimum cluster number of the oxygen clusters that form donors is m, $$\frac{d[TD]}{dt} = 2\sum_{n=m}^{M} \frac{d[O_n]}{dt}, \quad (5)$$

where [TD] represents a concentration of thermal donors TD.

<2> The method of predicting a behavior of thermal donors, according to <1> above, wherein the combination rate coefficients $k_{f1}$ and $k_{f2}$ in the above formulae (1) to (4) are expressed by the following formulae (6) and (7):

$$k_{f1} = 4\pi r_c D_{Oi} \quad (6),$$

$$k_{f2} = 4\pi r_c D_{O2} \quad (7),$$

where $r_c$ is a capture radius within which the interstitial oxygen $O_i$ and the oxygen dimers $O_2$ are captured by oxygen clusters $O_n$, $D_{oi}$ is a diffusion coefficient of the interstitial oxygen $O_i$, and $Do_2$ is a diffusion coefficient of the oxygen dimers $O_2$.

<3> The method of predicting a behavior of thermal donors, according to <2> above, wherein the diffusion coefficient $D_{oi}$ of interstitial oxygen $O_i$ in the above formula (6) has temperature dependency with a threshold value being 450° C.

<4> The method of predicting a behavior of thermal donors, according to <3> above, wherein when the heat treatment temperature T is 450° C. or higher, the diffusion coefficient $D_{oi}$ is expressed by the following formula (8):

$$D_{Oi} = \alpha_H \cdot \exp(-\beta_H/k_B T) \quad (8),$$

where $\alpha_H$ and $\beta_H$ are positive constants, $k_B$ is the Boltzmann constant, and T≥723 [K], when the heat treatment temperature T is lower than 450° C., the diffusion coefficient $D_{oi}$ is expressed by the following formula (9):

$$D_{Oi} = \alpha_L \cdot \exp(-\beta_L/k_B T) \quad (9),$$

where $\alpha_L$ and $\beta_L$ are positive constants, kB is the Boltzmann constant, and T<723 [K], and $\alpha_H > \alpha_L$ and $\beta_H > \beta_L$ are satisfied.

<5> The method of predicting a behavior of thermal donors, according to <4> above, wherein $\alpha_H = 0.13$, $\alpha_L = 5.1 \times 10^{-12}$, $\beta_H = 2.53$ [eV], $\beta_L = 1.0$ [eV] in the above formulae (8) and (9).

<6> A method of evaluating a silicon wafer, comprising:

a step of determining a concentration of thermal donors formed in the silicon wafer through heat treatment under a predetermined set of conditions using the method of predicting a behavior of thermal donors, according to any one of <1> to <5> above; and a step of determining a predicted resistivity of the silicon wafer having been subjected to heat treatment under the predetermined set of conditions based on the thermal donor concentration.

<7> A method of producing a silicon wafer comprising:

a step of ascertaining a set of heat treatment conditions in a device process performed on the silicon wafer;

a step of determining a predicted resistivity of the silicon wafer having been subjected to heat treatment under the set of heat treatment conditions for the device process using the method of evaluating a silicon wafer, according to <6> above; and a step of designing a target value of either an oxygen concentration or a resistivity of the silicon wafer before being subjected to the device process, based on the predicted resistivity.

Advantageous Effect

This disclosure can provide a method of accurately predicting the thermal donor formation behavior in a silicon wafer that can be applied to both short-time heat treatment and long-time heat treatment. Further, this disclosure can provide a method of evaluating a silicon wafer using the prediction method, and a method of producing a silicon wafer using the evaluation method.

DETAILED DESCRIPTION

Figure 1:
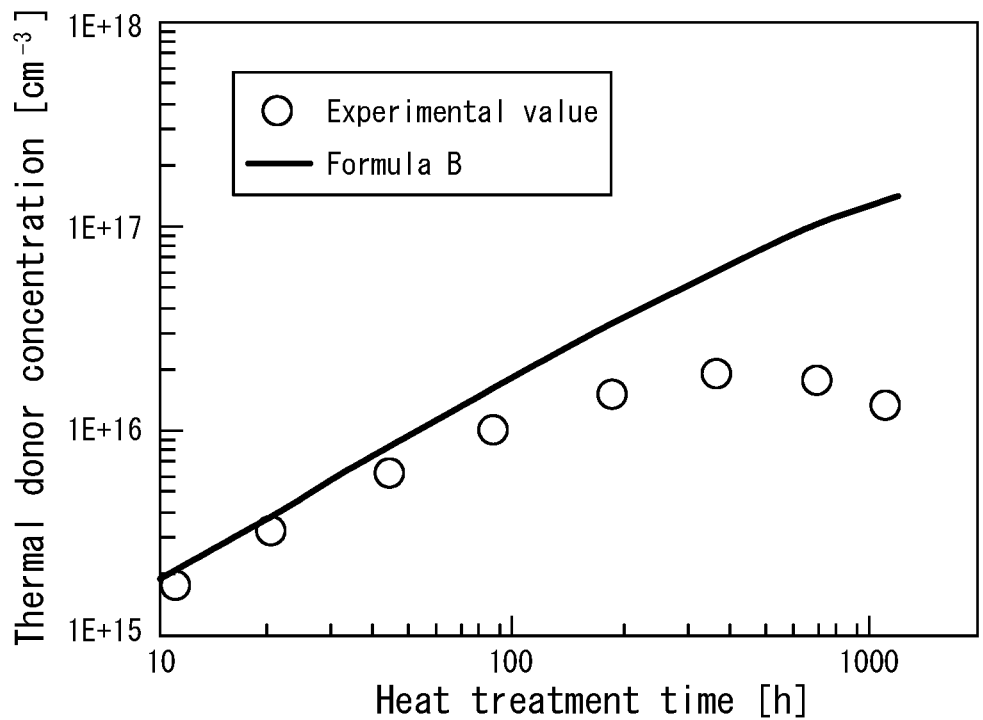
FIG. 1 is a graph illustrating the reproducibility of the thermal donor concentration during long-time low-temperature heat treatment, found by a formula obtained by improving a conventional technique.
Figure 2:
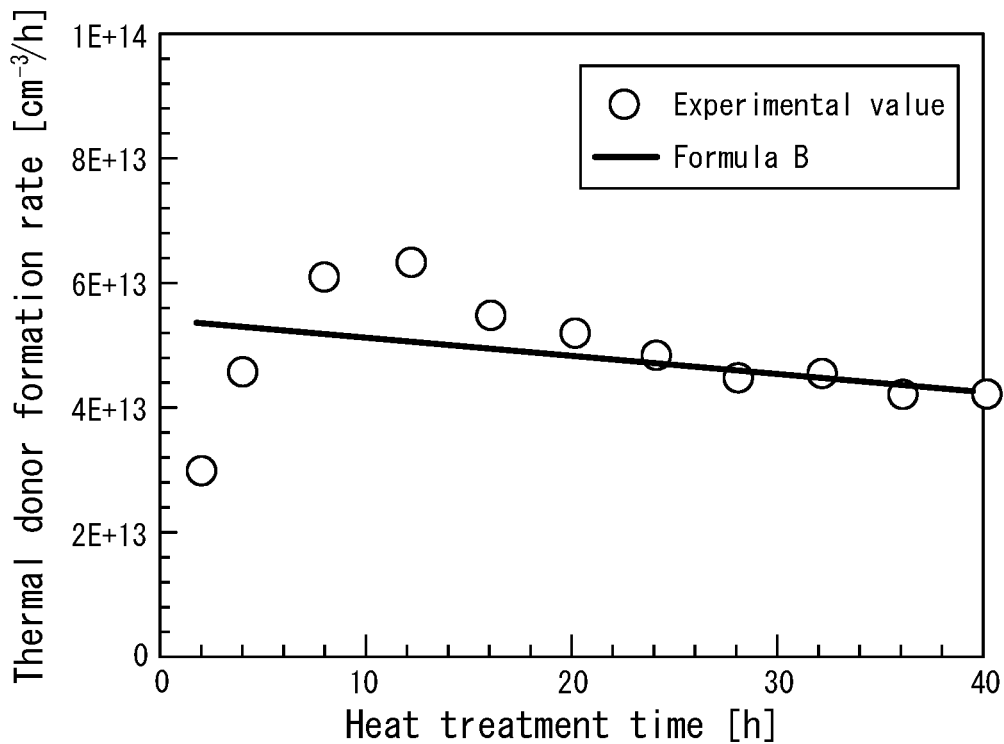
FIG. 2 is a graph illustrating the reproducibility of the thermal donor formation rate during short time low-temperature heat treatment, found by the above improved formula.

Prior to the description of one embodiment of this disclosure, a bond-dissociation model of oxygen clusters used in this disclosure is described. Note that an oxygen cluster herein means a constitution of a plurality of interstitial oxygen atoms $O_i$ bound together in which the number of the oxygen atoms is two or more, and is expressed as an oxygen cluster $O_n$ using the number n of the oxygen atoms in the interstitial oxygen atoms $O_i$. Hereinafter, the number of oxygen atoms in an oxygen cluster is referred to as a cluster number. Meanwhile, the maximum number of oxygen clusters that become donors is M (M is a natural number).

Accordingly, the oxygen atom number (cluster number) n is an integer satisfying 2≤n≤M. Typically, when the cluster number of oxygen clusters is 4 or larger, the oxygen clusters are considered to become donors, and when the cluster number is excessively large, the oxygen clusters are considered to be electrically inactive or there is considered to be no oxygen cluster. This disclosure also follows this knowledge. Further, particularly when the cluster number is 2, the oxygen cluster is called an oxygen dimer, particularly when the cluster number is 3, the oxygen cluster is called an oxygen trimer. Oxygen dimers and oxygen trimers are considered electrically neutral.

First, the inventors envisaged a bond-dissociation model in which the cluster number of oxygen clusters increases or decreases due to the bond dissociation of interstitial oxygen $O_i$ through the diffusion of interstitial oxygen $O_i$. Here, the combination rate coefficient $k_{f1}$ of when interstitial oxygen $O_i$ was bound to other interstitial oxygen or oxygen clusters was assumed to be fixed without depending on the cluster number of oxygen clusters after the combination. Meanwhile, the dissociation rate constant of when interstitial oxygen $O_i$ was dissociated from oxygen clusters $O_n$ was expressed as $k_{bn}$, and the dissociation rate constant of when interstitial oxygen $O_i$ was dissociated from oxygen dimers $O_2$ to form two interstitial oxygen atoms $O_i$ was designated $k_{b2}$. They assumed that not all $k_{b2}, k_{b3}, \ldots, k_{bn}, \ldots, k_{bM}$ would agree with each other. Based on this bond-dissociation model, the chemical equilibrium formula representing the model in which oxygen clusters $O_n$ are bound or dissociated through the diffusion of interstitial oxygen $O_i$ is as follows. Note that they assumed that interstitial oxygen $O_i$ was not dissociated from oxygen clusters of an oxygen cluster number of 13 or more, or even when some was dissociated, it would not be substantial dissociation. Further, the combination rate coefficient $k_{f1}$ is dependent on the heat treatment temperature as is typically believed.

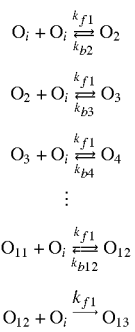

[1]

Further, the inventors also envisaged a bonding model in which the cluster number of oxygen clusters increases by 2 due to the bonding of oxygen dimers $O_2$ through the diffusion of the oxygen dimers $O_2$. Here, the combination rate coefficient $k_{f2}$ of when oxygen dimers $O_2$ were bound to other interstitial oxygen or oxygen clusters was assumed to be fixed without depending on the cluster number of oxygen clusters after the combination. Based on this bonding model, the chemical equilibrium formula of oxygen clusters $O_n$ formed through the diffusion of oxygen dimers $O_2$ is as follows. The combination rate coefficient $k_{f2}$ is dependent on the heat treatment temperature as is typically believed.

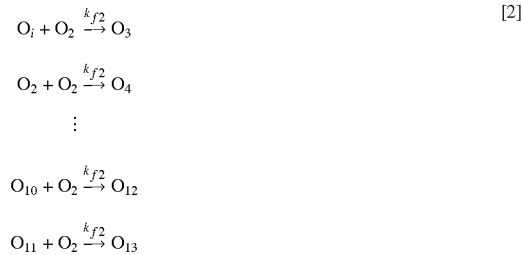

[2]

The reaction rate equations of interstitial oxygen, oxygen dimers, and oxygen clusters according to the above bond-dissociation model of interstitial oxygen $O_i$ and oxygen dimers $O_2$ are expressed by the following formulae (1) to (4). In the formulae (1) to (4), $[O_1]$ and $[O_n]$ represent the concentrations of interstitial oxygen $O_i$ and oxygen clusters $O_n$, respectively, and in particular, $[O_2]$ represents the concentration of oxygen dimers.

$$\frac{d[O_1]}{dt} = -2k_{f1}[O_1]^2 - k_{f1}[O_1]\left(\sum_{n=2}^{M-1}[O_n]\right) + \qquad (1)$$
$$2k_{b2}[O_2] - k_{f2}[O_2][O_1] + \sum_{n=3}^{M-1} k_{bn}[O_n]$$

$$\frac{d[O_2]}{dt} = k_{f1}[O_1]^2 - k_{f1}[O_2][O_1] - k_{b2}[O_2] + \qquad (2)$$
$$k_{b3}[O_3] - k_{f2}[O_2]\left([O_1] + 2[O_2] + \sum_{n=3}^{M-2}[O_n]\right)$$

$$\frac{d[O_n]}{dt} = k_{f1}[O_1][O_{n-1}] - k_{f1}[O_1][O_n] + \qquad (3)$$
$$k_{f2}[O_2]([O_{n-2}] - [O_n]) - k_{bn}[O_n] + k_{bn+1}[O_{n+1}]$$

$$\frac{d[O_M]}{dt} = k_{f1}[O_1][O_{M-1}] - k_{f1}[O_1][O_M] + k_{f2}[O_2][O_{M-2}] - k_{bM}[O_M] \qquad (4)$$

The following formula (10) holds since the concentration [TD] of thermal donors TD is the sum of the minimum cluster number of m and the maximum cluster number of M with which oxygen clusters $O_n$ become donors. The right-hand side coefficient of 2 in the following formula (10) is based on the assumption that one oxygen cluster having become a donor releases two electrons.

$$[TD] = 2\sum_{n=m}^{M}[O_n] \qquad (10)$$

Accordingly, the formation rate of thermal donors TD formed in the silicon wafer by being subjected to heat treatment under a predetermined set of conditions follows the following formula (5) based on the above formulae (1) to (4).

$$\frac{d[TD]}{dt} = 2\sum_{n=m}^{M}\frac{d[O_n]}{dt} \qquad (5)$$

Method of Predicting Behavior of Thermal Donors in Silicon Wafer

Figure 3:
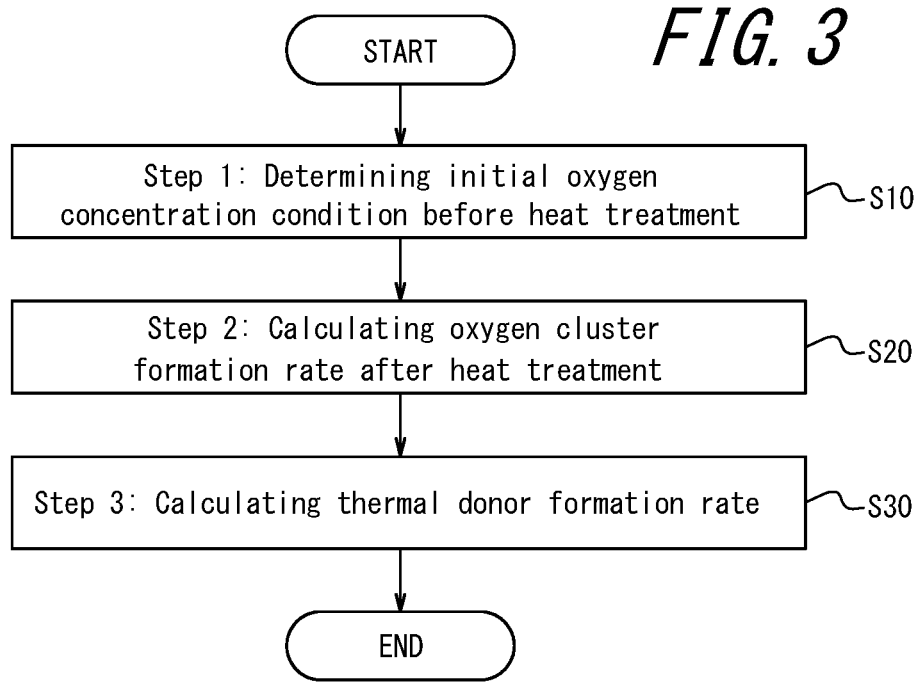
FIG. 3 is a flow chart illustrating a method of predicting the formation behavior of thermal donors in a silicon wafer according to one embodiment of this disclosure.

With the above in mind, a method of predicting the formation behavior of thermal donors in a silicon wafer according to one embodiment of this disclosure is described with reference to the flow chart of FIG. 3.

A method of predicting the behavior of thermal donors formed due to oxygen generated when heat treatment is performed on a silicon wafer, according to one embodiment of this disclosure includes: a first step S10 of setting an initial oxygen concentration condition before performing the heat treatment on the silicon wafer for reaction rate equations based on both a bond-dissociation model of oxygen clusters $O_n$ associated with the diffusion of interstitial oxygen $O_i$ and a bonding model of oxygen clusters $O_n$ associated with the diffusion of oxygen dimers $O_2$; a second step S20 of calculating the formation rate of oxygen clusters formed through the heat treatment using the reaction rate equations; and a third step S30 of calculating the formation rate of thermal donors formed through the heat treatment based on the formation rate of the oxygen clusters.

Here, the reaction rate equations used in this embodiment are the formulae (1) to (4) mentioned above, and are reshown below:

$$\frac{d[O_1]}{dt} = -2k_{f1}[O_1]^2 - k_{f1}[O_1]\left(\sum_{n=2}^{M-1}[O_n]\right) + \quad (1)$$

$$2k_{b2}[O_2] - k_{f2}[O_2][O_1] + \sum_{n=3}^{M-1} k_{bn}[O_n],$$

$$\frac{d[O_2]}{dt} = k_{f1}[O_1]^2 - k_{f1}[O_2][O_1] - k_{b2}[O_2] + \quad (2)$$

$$k_{b3}[O_3] - k_{f2}[O_2]\left([O_1] + 2[O_2] + \sum_{n=3}^{M-2}[O_n]\right),$$

$$\frac{d[O_n]}{dt} = k_{f1}[O_1][O_{n-1}] - k_{f1}[O_1][O_n] + \quad (3)$$

$$k_{f2}[O_2]([O_{n-2}] - [O_n]) - k_{bn}[O_n] + k_{bn+1}[O_{n+1}],$$

$$\frac{d[O_M]}{dt} = \quad (4)$$

$$k_{f1}[O_1][O_{M-1}] - k_{f1}[O_1][O_M] + k_{f2}[O_2][O_{M-2}] - k_{bM}[O_M],$$

where t represents the time; M is the maximum number of oxygen clusters that become donors; $[O_1]$ and $[O_n]$ represent the concentrations of interstitial oxygen $O_i$ and oxygen cluster $O_n$, respectively; $k_{f1}$ is the combination rate coefficient of interstitial oxygen bound to either other interstitial oxygen $O_i$ or oxygen clusters, depending on a heat treatment temperature; $k_{f2}$ is the combination rate coefficient of oxygen dimers bound to either other interstitial oxygen $O_i$ or oxygen clusters, depending on the heat treatment temperature; $k_{b2}$ is the dissociation rate constant of interstitial oxygen being dissociated from oxygen dimers to form two interstitial oxygen atoms; $k_{bn}$ is the dissociation rate constant of interstitial oxygen being dissociated from oxygen clusters of a cluster number n to form two interstitial oxygen atoms; n satisfies $3 \leq n \leq M-1$ in the above formula (3); and the formula (3) represents (M−3) simultaneous equations expressing change of $[O_n]$ where $3 \leq n \leq M-1$ with time.

These steps will be sequentially described in detail below.

First Step

In the first step S10, the initial oxygen concentration condition used in the above formulae (1) to (4) is set. The concentrations of $[O_1], [O_2], \ldots, [O_n], \ldots$, and $[O_M]$ may be specifically set based on the oxygen concentration of the silicon wafer. Further, the oxygen concentration of the silicon wafer may be used as $[O_1]$ before low-temperature heat treatment assuming that all oxygen in the silicon wafer before being subjected to heat treatment is all interstitial oxygen $O_i$. To simplify calculations, the initial oxygen concentration condition is preferably set as a condition for after performing donor killer heat treatment.

Second Step

In the second step S20, the simultaneous differential equations of the formulae (1) to (4) may be numerically calculated in accordance with the conditions for heat treatment performed on the silicon wafer (heat treatment time t, heat treatment temperature T) under the initial oxygen concentration, set in the first step S10, thereby determining $[O_1], [O_2], \ldots, [O_n], \ldots$, and $[O_M]$.

Here, the combination rate coefficients $k_{f1}$ and $k_{f2}$ of interstitial oxygen $O_i$ and oxygen dimer $O_2$ respectively may be handled as constants found by a regression analysis from test results, and preferably follows the following formulae (6) and (7):

$$k_{f1} = 4\pi r_c D_{Oi} \quad (6),$$

$$k_{f2} = 4\pi r_c D_{O2} \quad (7),$$

where $r_c$ is a capture radius within which the interstitial oxygen $O_i$ and the oxygen dimers $O_2$ are captured by oxygen clusters $O_n$, $D_{oi}$ is a diffusion coefficient of the interstitial oxygen $O_i$, and $Do_2$ is a diffusion coefficient of the oxygen dimers $O_2$). The capture radius $r_c$ has been reported in known literature and can be used. Further, the capture radius may be optimized to match the test results. The diffusion coefficients $D_{oi}$ and $D_{O2}$ can be found in an Arrhenius plot.

For example, in NPL 1 mentioned above, the capture radius $r_c$ is assumed to be 5 [angstrom] (0.5 nm). Further, for the diffusion coefficient $D_{Oi}$ of interstitial oxygen, $D_{oi}(T) = 0.13 \times \exp(-2.53 \text{ [eV]}/k_B T)$ [cm$^2$/s] is disclosed in NPL 1 and PTL 1 mentioned above.

Further, the dissociation rate constant $k_{b2}$ of interstitial oxygen being dissociated from oxygen dimers to form two interstitial oxygen atoms and the dissociation rate constant $k_{bn}$ of interstitial oxygen being dissociated from oxygen clusters of a cluster number n can be found by a regression analysis using test results. According to the studies made by the inventors, the dissociation rate constant $k_{bn}$ is a value dependent on the temperature, and is approximately within the following range at 350° C. to 450° C.: $10^{-7} \leq k_{b2} \leq 10^{-2}$, $10^{-6} \leq k_{b3} \leq 10^{-2}$, $10^{-8} \leq k_{b4} \leq 10^{-4}$, $10^{-9} \leq k_{b5} \leq 10^{-5}$, $10^{-9} \leq k_{b6} \leq 10^{-5}$, $10^{-9} \leq k_{b7} \leq 10^{-4}$, $10^{-9} \leq k_{b8} \leq 10^{-4}$, $10^{-8} \leq k_{b9} \leq 10^{-4}$, $10^{-10} \leq k_{b10} \leq 10^{-5}$, $10^{-10} \leq k_{b11} \leq 10^{-5}$, $10^{-5} \leq k_{b12} \leq 10^{-6}$ [s$^{-1}$]. Further, the dissociation rate constant may be a function of an Arrhenius equation dependent on the temperature as in the formulae (8) and (9). It should readily be understood that the range of the dissociation rate constant (tendency) here is only an example, and when this embodiment is applied, various modifications are possible by optimization such that the range corresponds to that in the actual experimental results.

Third Step

In the third step S30, the formation rate of thermal donors formed through heat treatment is calculated using the following formula (5) in which the minimum cluster number of m and the maximum cluster number of M allow oxygen clusters $O_n$ to become donors based on the formation rate of each oxygen cluster, calculated in the second step S20.

$$\frac{d[TD]}{dt} = 2\sum_{n=m}^{M} \frac{d[O_n]}{dt} \quad (5)$$

In general, the minimum cluster number m of an oxygen cluster that can become a donor is said to be 4; thus, preferably m=4. Further, according to a known document using Fourier-transform infrared spectroscopy (FTIR) (W. Gotz et al.: "Thermal donor formation and annihilation at temperatures above 500° C. in Czochralski-grown Si"; Journal of Applied Physics; Jul. 6, 1998; Vol. 84, No. 7, pp. 3561-3568), nine kinds of thermal donors are identified; thus, M=12 is preferred for the maximum cluster number M. It should readily be understood that m=4 and M=12 are mere examples, and when this embodiment is applied, various modifications are possible.

Thus, through the first step S10, the second step S20, and the third step S30, the formation rate of thermal donors can be determined. Accordingly, the behavior of thermal donors formed while heat treatment is performed on a silicon wafer can be predicted more accurately than conventional techniques. Further, the prediction method according to this embodiment is implemented by calculations based on the bond-dissociation model of oxygen clusters described above, and thus can be applied to both short-time heat treatment and long-time heat treatment. In addition, based on the thermal donor formation rate, the thermal donor concentration (i.e., the amount of thermal donors) after heat treatment can also be determined. The reproducibility of experimental results obtained by this embodiment will be described in more detail using Examples 1 and 2 below.

According to this embodiment, heat treatment at a lower temperature than donor killer heat treatment allows for predicting tendencies of the formation behavior of thermal donors from the diffusion coefficient $D_{Oi}$ of interstitial oxygen $O_i$ using a straight line approximation equation of a known Arrhenius plot regardless of the heat treatment temperature. As a straight line approximation of a known Arrhenius plot, for example, $D_{oi}(T)=0.13\times\exp(-2.53\,[eV]/k_B T)$ [cm$^2$/s] is known. Here, as described in more detail using Example 3 below, the studies made by the inventors confirmed that the temperature dependence of the diffusion coefficient $D_{oi}$ of interstitial oxygen $O_i$ changed at a threshold of 450° C. In the light of this experimental result, the diffusion of interstitial oxygen $O_i$ is considered to be promoted (such a phenomenon is hereinafter referred to as "enhanced diffusion") at temperatures lower than 450° C.

Accordingly, in the light of the experimental results of Example 3 below, in order to predict the formation behavior of thermal donors more accurately, the diffusion coefficient $D_{oi}$ is preferably handled as having temperature dependence that changes at the threshold: a heat treatment temperature of 450° C. Thus, the diffusion coefficient $D_{oi}$ of interstitial oxygen $O_i$ in the formula (6) above preferably has temperature dependence that changes at a threshold of 450° C.

Given these factors, when the heat treatment temperature T is 450° C. or higher, the diffusion coefficient $D_{oi}$ is expressed by the following formula (8):

$$D_{Oi}=\alpha_H \cdot \exp(-\beta_H/k_B T) \quad (8),$$

where $\alpha_H$ and $\beta_H$ are positive constants, $k_B$ is the Boltzmann constant, and T≥723 [K]), when the heat treatment temperature T is lower than 450° C., the diffusion coefficient $D_{oi}$ is expressed by the following formula (9):

$$D_{oi}=\alpha_L \cdot \exp(-\beta_L/k_B T) \quad (9),$$

where $\alpha_L$ and $\beta_L$ are positive constants, kB is the Boltzmann constant, and T<723 [K], and preferably $\alpha_H<\alpha_L$ and $\beta_H>\beta_L$. In particular, in the above formulae (8) and (9), preferably $\alpha_H=0.13$, $\alpha_L=5.1\times10^{-12}$ and $\beta_H=2.53$ [eV], $\beta_L=1.0$ [eV].

Using the enhanced diffusion model mentioned above, the formation behavior of thermal donors can be predicted more accurately.

Specific aspects in this embodiment will be described below; however, these are mere examples.

As the silicon wafer, a slice of a single crystal silicon ingot grown by the Czochralski process (CZ process) or the floating zone melting process (FZ process), cut with a wire saw or the like, can be used. The oxygen concentration of a silicon wafer formed by the CZ process (hereinafter "CZ wafer") is higher than that formed by the FZ process and is susceptible to the change in resistivity due to the formation of thermal donors. For this reason, the prediction method of this embodiment is preferably used for a CZ wafer.

The conductivity type of a silicon wafer to which the prediction method of this embodiment is applied may either be the p-type or the n-type. Further, the oxygen concentration of the silicon wafer is not particularly limited and is typically $4\times10^{17}$ atoms/cm$^3$ to $22\times10^{17}$ atoms/cm$^3$ (ASTM F121-1979). The prediction method of this embodiment is preferably applied to a silicon wafer having an oxygen concentration of $10\times10^{17}$ atoms/cm$^3$ (ASTM F121-1979) or higher in which the thermal donors have significant effects.

Further, heat treatment conditions in this embodiment are not particularly limited; the method is effective in predicting the behavior of thermal donors formed by heat treatment for a significantly short time of approximately several minutes to several hours, and the method is also effective in predicting the behavior of thermal donors formed by heat treatment for a long time of more than 100 hours. Specifically, this embodiment is preferably applied when the heat treatment time is 1 minute or more and 50 hours or less, and is more preferably applied when the heat treatment time is 20 hours or less. On the other hand, this embodiment is preferably applied when the heat treatment time is 100 hours or more, and this embodiment is more preferably applied when the heat treatment time is 200 hours or more. The heat treatment temperature is also not particularly limited as long as the heat treatment is not donor killer heat treatment; for example, this embodiment is preferably applied to heat treatment at 300° C. or more and 600° C. or less, and is particularly preferably applied to heat treatment at a temperature lower than 450° C. Further, in calculating the thermal donor formation rate or the thermal donor concentration after heat treatment in this embodiment, the heat treatment temperature need not be constant. Heat treatment conditions simulating an actual device process can be applied.

Note that the above bond-dissociation model of oxygen clusters need not necessarily be theoretically true, and this embodiment predicts the thermal donor formation behavior in a silicon wafer according to the formulae (1) to (5) above.

Further, the calculations of the formation rate and the amount of oxygen clusters formed under a predetermined set of heat treatment conditions (i.e., oxygen cluster concentration after heat treatment) are inextricably linked to each other; similarly, the calculations of the formation rate and the formation amount (i.e., thermal donor concentration) of thermal donors are inextricably linked to each other. Each of these is one aspect in predicting the thermal donor formation behavior. Accordingly, calculating the concentration of oxygen clusters or thermal donors after heat treatment is equivalent to calculating the formation rate of the oxygen clusters.

Method of Evaluating Silicon Wafer

Further, a silicon wafer can be evaluated using the embodiment of a method of predicting the formation behavior of thermal donors in a silicon wafer. First, a step of determining the concentration of thermal donors formed in a silicon wafer through heat treatment under a predetermined set of conditions is performed according to the embodiment of a method of predicting the formation behavior of thermal donors. For the predetermined set of conditions, heat treatment history on the silicon wafer in the device process is preferably used. When high-temperature heat treatment corresponding to donor killer heat treatment is included, only the heat treatment history after the high-temperature heat treatment may be used. Based on the thermal donor concentration found, a step of determining the predicted resistivity of the silicon wafer having been subjected to the heat treatment under the predetermined set of conditions is performed. The resistivity can be determined using Irvin curves based on the concentration of the thermal donors formed. This method of evaluating a silicon wafer allows for accurately evaluating whether or not the resistivity of a silicon wafer which is subjected to heat treatment under a predetermined set of conditions meets a specific specification.

Method of Producing Silicon Wafer

Further, it is also preferred to produce a silicon wafer using the above evaluation method. First, a step of ascertaining a set of heat treatment conditions in a device process performed on the silicon wafer is performed. When high-temperature heat treatment corresponding to donor killer heat treatment is included, the inclusion and heat treatment conditions after the high-temperature heat treatment may be ascertained, whereas when high-temperature heat treatment is not included, the entire thermal history is preferably ascertained. Whereupon, a step of determining the predicted resistivity of the silicon wafer having been subjected to heat treatment under the set of heat treatment conditions for the device process is performed using the method of evaluating a silicon wafer. Next, based on the predicted resistivity determined, a step of designing a target value of either the oxygen concentration or the resistivity of the silicon wafer before being subjected to the device process is performed, thereby producing a silicon wafer according to this design. With the use of a silicon wafer fabricated using the method of producing a wafer, of which resistivity after the device process is considered, detrimental effects on the device characteristics due to the formation of thermal donors can be reduced.

EXAMPLE 1

Prediction Accuracy when Short-Time Heat Treatment is Performed

First, to grasp the reproducibility of the method of predicting the thermal donor formation behavior in a silicon wafer according to this disclosure, the inventors compared the experimental value and the calculated value of the thermal donor formation rate when short-time low-temperature heat treatment was performed. The experimental value of the thermal donor formation rate was determined first in the following manner.

A (100) p-type silicon single crystal ingot having a diameter of 300 mm was grown by the CZ process. After slicing the single crystal silicon ingot to form silicon wafers, the oxygen concentration of each silicon wafer was measured by Fourier-transform infrared spectroscopy. The oxygen concentration of the silicon wafers varied from $4\times10^{17}$ [cm$^{-3}$] to $22\times10^{17}$ [cm$^{-3}$] (ASTM F121-1979, hereinafter the same applies to the oxygen concentration) depending on the growth conditions and slicing positions of the single crystal silicon ingot. Of those, a silicon wafer with an oxygen concentration of $11\times10^{17}$ [cm$^{-3}$] was used. In order to eliminate thermal donors formed in the crystal growth of the silicon wafer, donor killer treatment was performed in a nitrogen atmosphere at 700° C. for 15 min. After that, low-temperature heat treatment was performed in a nitrogen atmosphere at 450° C. for 2 hours to 40 hours, thereby generating thermal donors in the silicon wafer. The specific resistance of each silicon wafer was measured according to a specific resistance measurement method using a four-point probe array according to JIS H 0602 (1995). The carrier concentration was measured from Irvin curves based on the measurement result of the specific resistance and the measurement result of the specific resistance before low-temperature heat treatment. Further, based on the carrier concentrations before and after low-temperature heat treatment by which thermal donors were formed, the amount of thermal donors formed was determined. Further, the thermal donor formation rate was found from the relationship between the heat treatment time and the amount of thermal donors formed (thermal donor concentration). The measured thermal donor formation rate is given in FIG. 4.

Next, the thermal donor formation rate of a silicon wafer equivalent to one in the above experiment, which had been subjected to low-temperature heat treatment was calculated using the formulae (1) to (7) according to this disclosure. Oxygen after donor killer treatment was all assumed to be interstitial oxygen $O_i$: $[O_i]=11\times10^{17}$ [cm$^{-3}$]. Note that as the diffusion coefficient of interstitial oxygen $O_i$, $D_{oi}(T)=0.13\times\exp(-2.53\ [/k_BT])$ cm$^2$/s] in the known document was used. Further, as the diffusion coefficient $D_{O2}$ of oxygen dimers $D_{O2}(T)=1.7\times\exp(-1.9\ [eV]/k_BT)$ [cm$^2$/s] was used. Further, the capture radius $r_c$ was set to 7 [angstrom] (0.7 nm). The dissociation rate constants $k_{b2}$, $k_{b3}$, ..., $k_{bn}$, and $k_{bM}$ were optimized by a regression analysis based on the above experimental values. Further, the minimum cluster number with which oxygen clusters become donors was set to 4 (m=4), and the maximum cluster number with which oxygen clusters become donors was set to 12 (M=12). The result of numerical calculations is given as Example 1 in FIG. 4.

For the comparison with Example 1, the calculation result of the thermal donor formation rate according to Formula B mentioned above is also given in FIG. 4.

Figure 4:
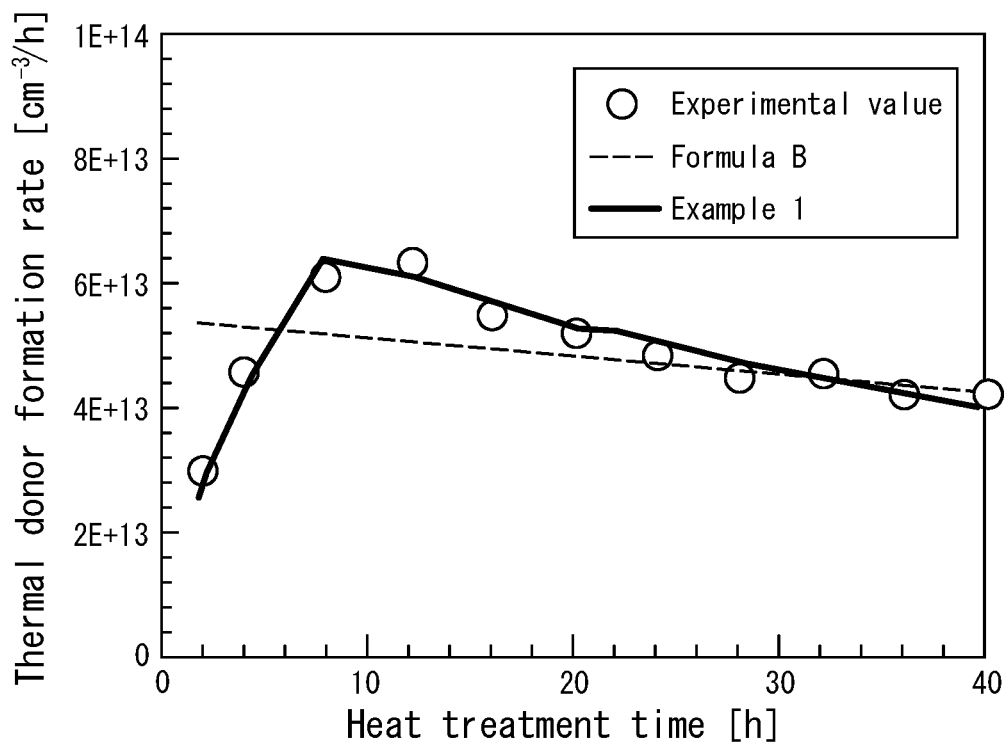
FIG. 4 is a graph illustrating the reproducibility of the thermal donor formation rate during short time low-temperature heat treatment in Example 1.

As illustrated in FIG. 4, it is experimentally confirmed that the thermal donor formation rate increases for the first approximately 10 hours of heat treatment and decreases after that. This decrease was found to be accurately reproduced in Example 1. On the other hand, using Formula B described above, the formation behavior of thermal donors in such a heat treatment for an extremely short time cannot be reproduced.

EXAMPLE 2

Prediction Accuracy when Long-Time Heat Treatment is Performed

Figure 5:
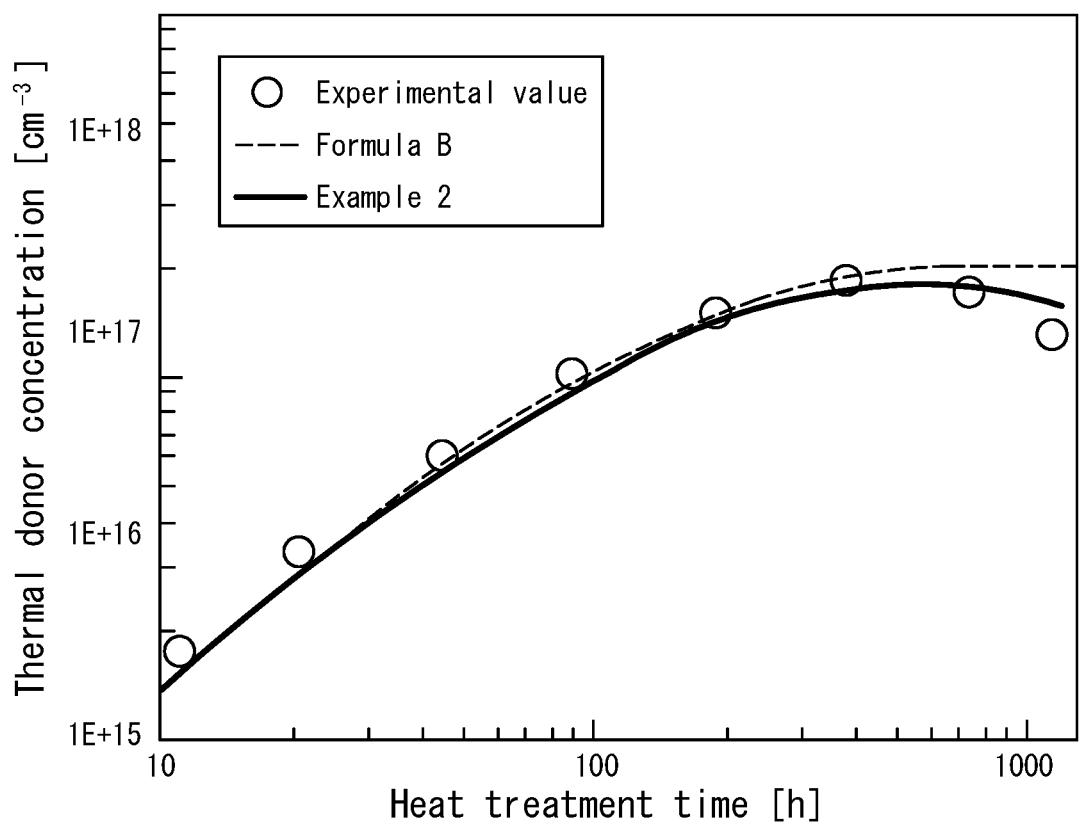
FIG. 5 is a graph illustrating the reproducibility of the thermal donor concentration during long time low-temperature heat treatment in Example 2.

Next, to grasp the reproducibility of the method of predicting the thermal donor formation behavior in a silicon wafer according to this disclosure, the experimental value and the calculated value of the thermal donor concentration when long-time low-temperature heat treatment was performed were compared. For the experimental value, of the concentrations of thermal donors formed by low-temperature heat treatment disclosed in NPL 2 (Y. Kamiura et al.), the value of when the oxygen concentration of the silicon wafer was $13 \times 10^{17}$ [cm$^{-3}$] was used. FIG. 5 depicts the experimental values. The heat treatment temperature was 450° C., and the heat treatment time was 10 hours to more than 1000 hours.

On the other hand, the thermal donor concentration of a silicon wafer equivalent to one in the above experiment, which had been subjected to low-temperature heat treatment was calculated using the formulae (1) to (7) and (10) according to this disclosure. The parameters used in Example 2 were the same as those in Example 1 except for the oxygen concentration of the silicon wafer and heat treatment time. The result of numerical calculations is given as Example 2 in FIG. 5.

For the comparison with Example 1, the calculation result of the thermal donor formation rate according to Formula B mentioned above is also given in FIG. 5.

It was confirmed that a reduction of the thermal donor concentration by low-temperature heat treatment for more than 400 hours was reproduced in Example 2. On the other hand, using Formula B described above, the formation behavior of thermal donors in such a heat treatment for a long time cannot be reproduced.

EXAMPLE 3

Temperature Dependence of Diffusion Coefficient

To study the oxygen concentration dependence of the thermal donor formation rate, the inventors conducted the following experiment. The experimental value of the thermal donor formation was determined first in the following manner.

Figure 6:
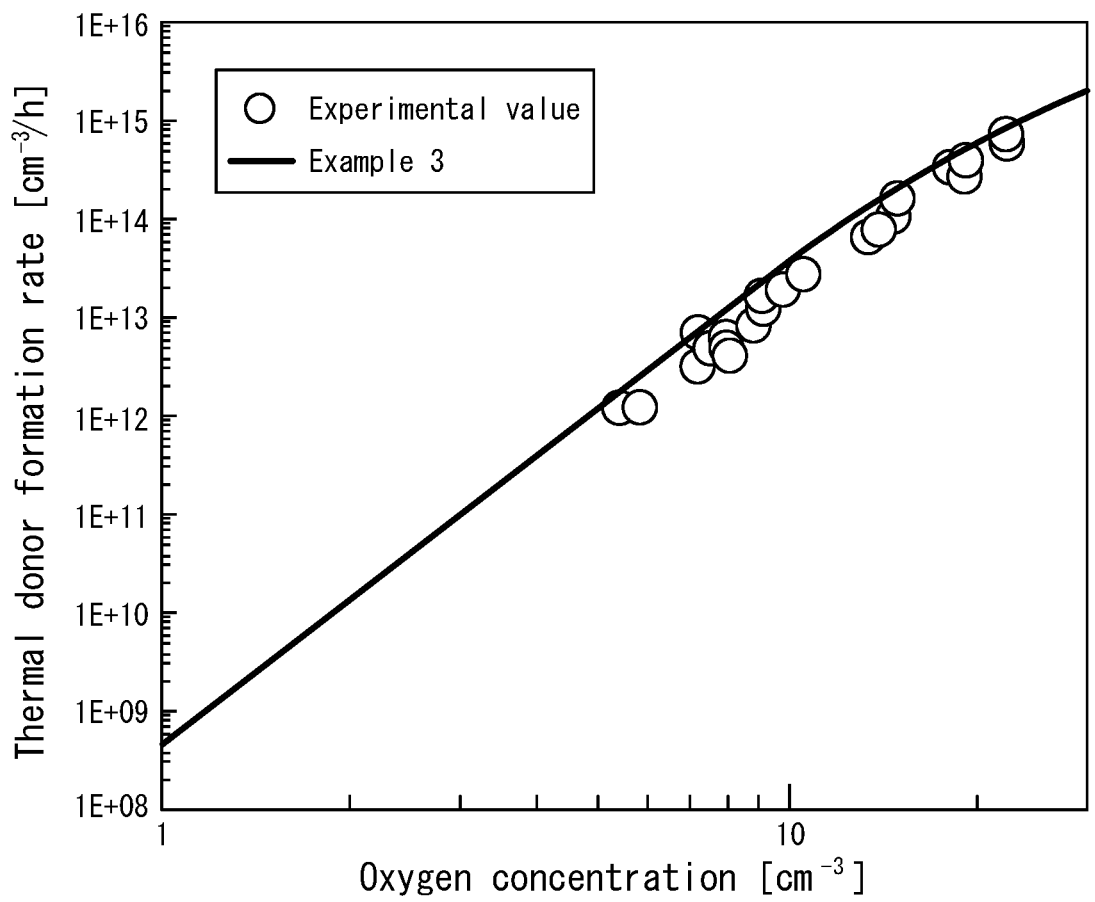
FIG. 6 is a graph illustrating the relationship between the oxygen concentration of a silicon wafer and the thermal donor formation rate at a heat treatment temperature of 450° C. in Example 3.

The silicon wafers having different oxygen concentrations ($4 \times 10^{17}$ to $22 \times 10^{17}$ [cm$^{-3}$]) formed in Example 1 were subjected to donor killer treatment in a nitrogen atmosphere at 700° C. for 15 min. After that, thermal donor formation heat treatment was performed in a nitrogen atmosphere at 450° C., 400° C., and 350° C., thereby forming thermal donors. The heat treatment time was 32 hours at 450° C., 32 hours at 400° C., and 80 hours at 350° C. The thermal donor formation rate was determined similarly as in Example 1. Experimental values of the thermal donor formation rate at temperatures of 450° C., 400° C., and 350° C. are given in FIG. 6, FIG. 7, and FIG. 8, respectively.

First, the thermal donor formation rate was calculated using the formulae (1) to (7) according to this disclosure as in Example 1. The parameters used for this calculation were the same as those in Example 1 except for the oxygen concentration of the silicon wafer and heat treatment time. The results obtained by this calculation for 450° C., 400° C., and 350° C. are given as Example 3, Example 4A, and Example 5A in FIG. 6, FIG. and FIG. 8, respectively.

Also when the results of Examples 4A and 5A are used, the tendency of thermal donors to increase or decrease in their formation behavior can be grasped to a certain degree. However, FIG. 6, FIG. 7, and FIG. 8 suggest that the enhanced diffusion of interstitial atoms increased the diffusion coefficient thereof at a temperature lower than 450° C. Based on these experimental results, the enhancement corresponding to the diffusion coefficient illustrated in FIG. 9 was assumed using the formulae (8) and (9) according to this disclosure. In FIG. 9, $\alpha_H$=0.13, $\alpha_L$=5.1×10$^{-12}$, $\beta_H$=2.53 [eV], and $\beta_L$=1.0 [eV]. The graphs in FIGS. 7 and 8 were obtained by recalculating the thermal donor formation rate of when the heat treatment temperature was 400° C. and 350° C. (Example 413 and Example 5B, respectively) considering the enhanced diffusion.

Figure 7:
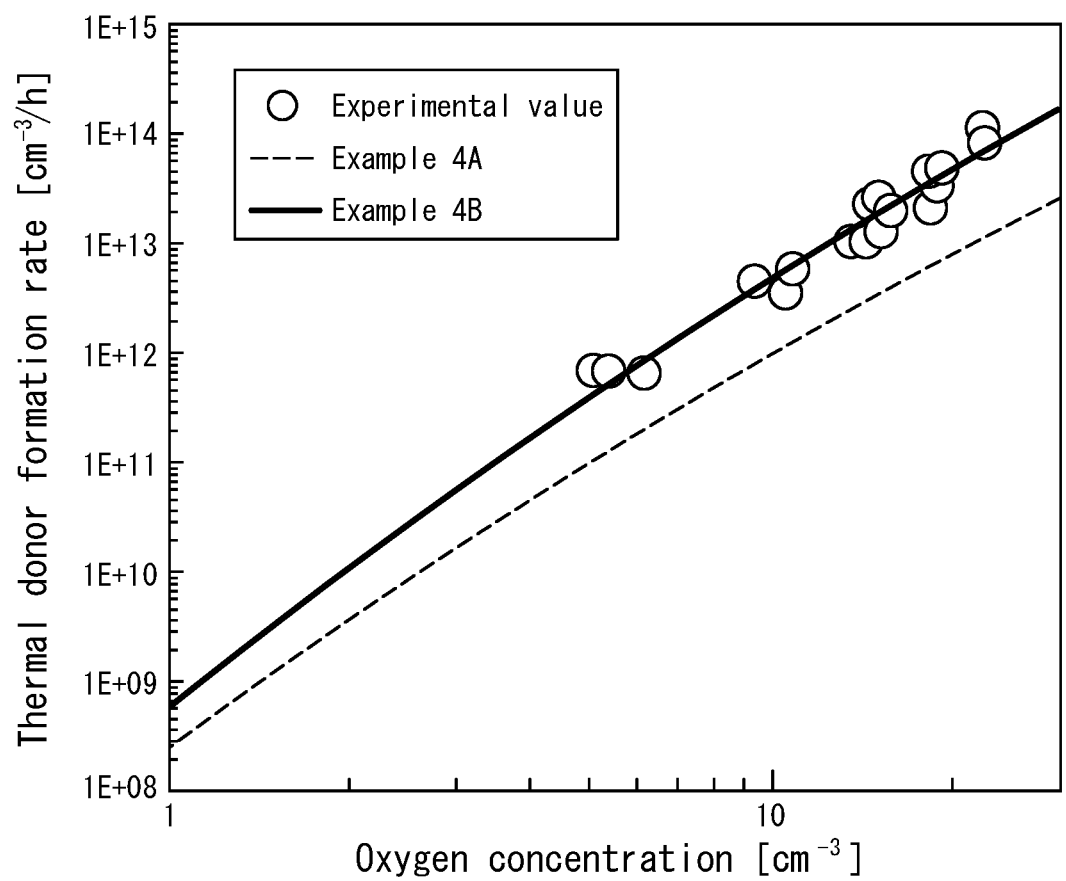
FIG. 7 is a graph illustrating the relationship between the oxygen concentration of a silicon wafer and the thermal donor formation rate at a heat treatment temperature of 400° C. in Example 3.
Figure 8:
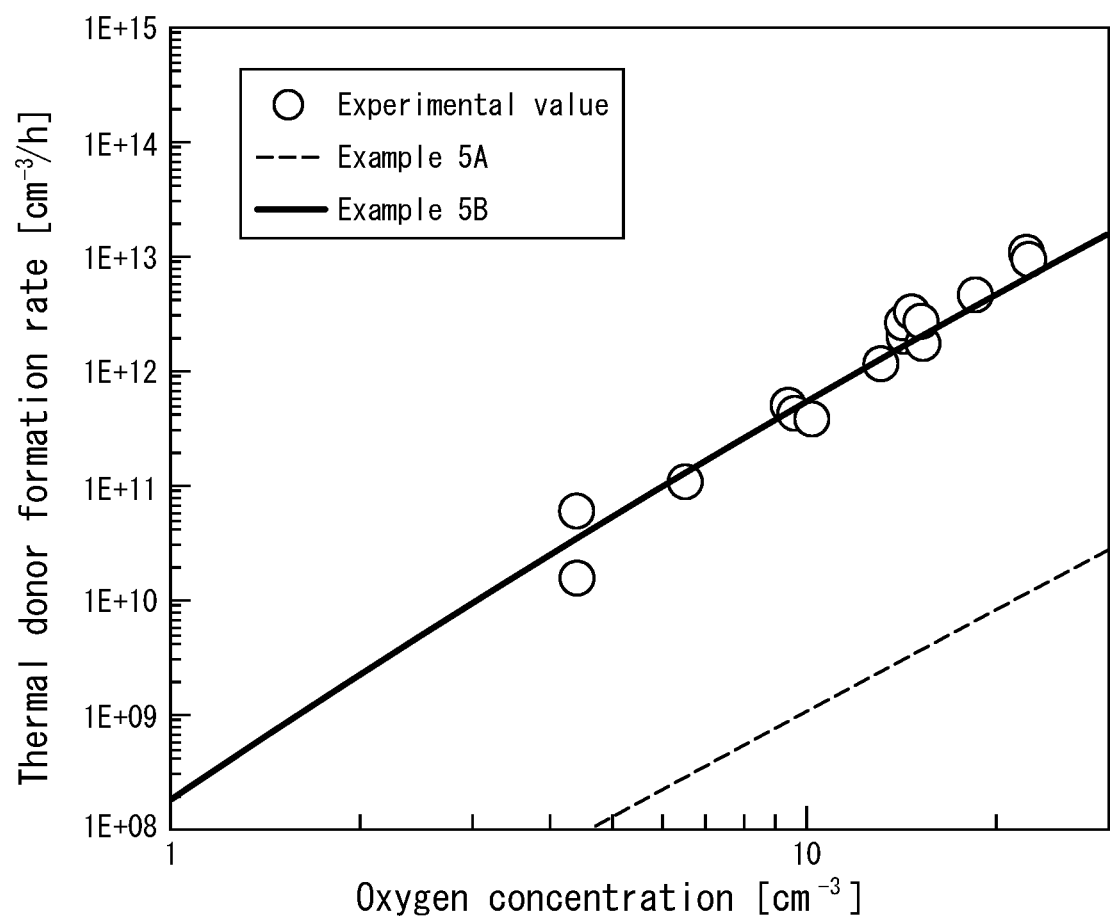
FIG. 8 is a graph illustrating the relationship between the oxygen concentration of a silicon wafer and the thermal donor formation rate at a heat treatment temperature of 350° C. in Example 3.
Figure 9:
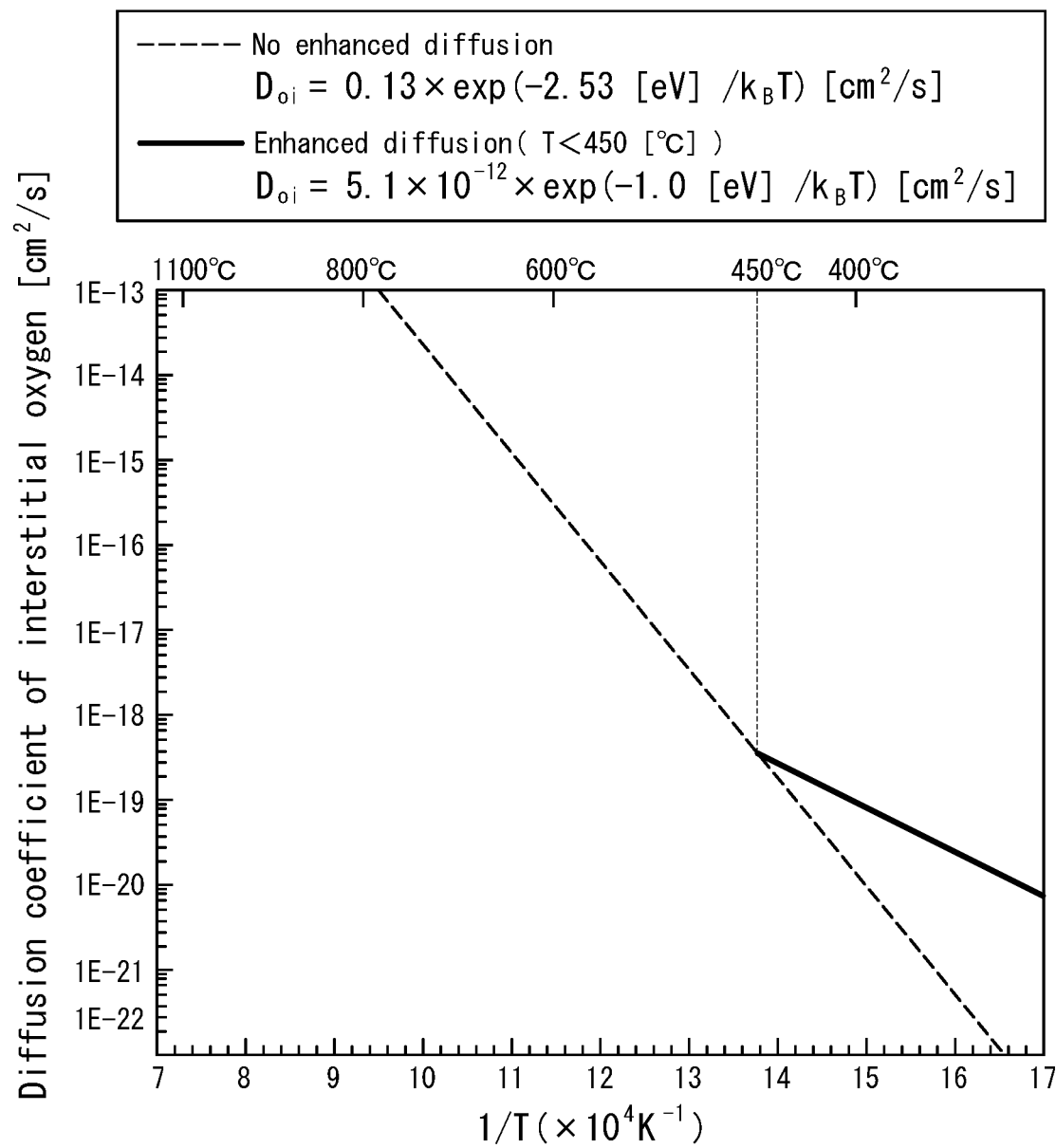
FIG. 9 is a graph illustrating an Arrhenius plot of the heat treatment temperature and the diffusion coefficient of interstitial oxygen in Example 3.

FIGS. 7 and 8 demonstrate that the experimental results were well reproduced by the enhanced diffusion model of interstitial oxygen at a temperature lower than 450° C. At a temperature lower than 450° C., interstitial silicon and interstitial oxygen form a complex to undergo enhanced diffusion; however, since its bonding is instable, they would be dissociated at high temperatures.

INDUSTRIAL APPLICABILITY

This disclosure provides a method of accurately predicting the thermal donor formation behavior in a silicon wafer that can be applied to both short-time heat treatment and long-time heat treatment, a method of evaluating a silicon wafer using the prediction method, and a method of producing a silicon wafer using the evaluation method.

The invention claimed is:

1. A method of predicting a formation behavior of thermal donors formed due to oxygen generated when heat treatment is performed on a silicon wafer, comprising:
   a first step of setting an initial oxygen concentration condition before performing the heat treatment on the silicon wafer for reaction rate equations based on both a bond-dissociation model of oxygen clusters associated with diffusion of interstitial oxygen and a bonding model of oxygen clusters associated with diffusion of oxygen dimers;
   a second step of calculating a formation rate of oxygen clusters formed through the heat treatment using the reaction rate equations; and
   a third step of calculating a formation rate of thermal donors formed through the heat treatment based on the formation rate of the oxygen clusters,
   wherein the reaction rate equations are the following formulae (1) to (4):

$$\frac{d[O_1]}{dt} = -2k_{f1}[O_1]^2 - k_{f1}[O_1]\left(\sum_{n=2}^{M-1}[O_n]\right) + \quad (1)$$

$$2k_{b2}[O_2] - k_{f2}[O_2][O_1] + \sum_{n=3}^{M-1} k_{bn}[O_n],$$

$$\frac{d[O_2]}{dt} = k_{f1}[O_1]^2 - k_{f1}[O_2][O_1] - k_{b2}[O_2] + \quad (2)$$

$$k_{b3}[O_3] - k_{f2}[O_2]\left([O_1] + 2[O_2] + \sum_{n=3}^{M-2}[O_n]\right),$$

-continued $$\frac{d[O_n]}{dt} = k_{f1}[O_1][O_{n-1}] - k_{f1}[O_1][O_n] + \qquad (3)$$
$$k_{f2}[O_2]([O_{n-2}] - [O_n]) - k_{bn}[O_n] + k_{bn+1}[O_{n+1}],$$

$$\frac{d[O_M]}{dt} = \qquad (4)$$
$$k_{f1}[O_1][O_{M-1}] - k_{f1}[O_1][O_M] + k_{f2}[O_2][O_{M-2}] - k_{bM}[O_M],$$

where t represents a time; M is a maximum number of oxygen clusters that become donors; $[O_1]$ and $[O_n]$ represent concentrations of interstitial oxygen $O_i$ and oxygen cluster $O_n$, respectively; $k_{f1}$ is a combination rate coefficient of interstitial oxygen bound to either other interstitial oxygen $O_i$ or oxygen clusters, depending on a heat treatment temperature; $k_{f2}$ is a combination rate coefficient of oxygen dimers bound to either other interstitial oxygen $O_i$ or oxygen clusters, depending on the heat treatment temperature; $k_{b2}$ is a dissociation rate constant of interstitial oxygen being dissociated from oxygen dimers to form two interstitial oxygen atoms; $k_{bn}$ is a dissociation rate constant of interstitial oxygen being dissociated from oxygen clusters of a cluster number n to form two interstitial oxygen atoms; n satisfies $3 \leq n \leq M-1$ in the above formula (3); and the formula (3) represents (M-3) simultaneous equations expressing change of $[O_n]$ where $3 \leq n \leq M-1$ with time, and in the third step, the thermal donor formation rate is calculated using the following formula (5) in which a minimum cluster number of the oxygen clusters that form donors is m, $$\frac{d[TD]}{dt} = 2\sum_{n=m}^{M} \frac{d[O_n]}{dt}, \qquad (5)$$

where [TD] represents a concentration of thermal donors TD.

2. The method of predicting a behavior of thermal donors, according to claim 1,
wherein the combination rate coefficients $k_{f1}$ and $k_{f2}$ in the above formulae (1) to (4) are expressed by the following formulae (6) and (7):

$$k_{f1} = 4\pi r_c D_{Oi} \qquad (6),$$

$$k_{f2} = 4\pi r_c D_{O2} \qquad (7),$$

where $r_c$ is a capture radius within which the interstitial oxygen $O_i$ and the oxygen dimers $O_2$ are captured by oxygen clusters $O_n$, $D_{oi}$ is a diffusion coefficient of the interstitial oxygen $O_i$, and $D_{O2}$ is a diffusion coefficient of the oxygen dimers $O_2$.

3. The method of predicting a behavior of thermal donors, according to claim 2,
wherein the diffusion coefficient $D_{oi}$ of interstitial oxygen $O_i$ in the above formula (6) has temperature dependency with a threshold value being 450° C.

4. The method of predicting a behavior of thermal donors, according to claim 3,
wherein when the heat treatment temperature T is 450° C. or higher, the diffusion coefficient $D_{oi}$ is expressed by the following formula (8):

$$D_{Oi} = \alpha_H \cdot \exp(-\beta_H / k_B T) \ldots (8),$$

where $\alpha_H$ and $\beta_H$ are positive constants, $k_B$ is the Boltzmann constant, and $T \geq [K]$, when the heat treatment temperature T is lower than 450° C., the diffusion coefficient $D_{oi}$ is expressed by the following formula (9):

$$D_{oi} = \alpha_L \cdot \exp(-\beta_L / k_B T) \qquad (9),$$

where $\alpha_L$ and $\beta_L$ are positive constants, kB is the Boltzmann constant, and $T < 723$ [K], and
$\alpha_H > \alpha_L$ and $\beta_H > \beta_L$ are satisfied.

5. The method of predicting a behavior of thermal donors, according to claim 4,
wherein $\alpha_H = 0.13$, $\alpha_L = 5.1 \times 10^{-12}$, $\beta_H = 2.53$ [eV], $\beta_L = 1.0$ [eV] in the above formulae (8) and (9).

6. A method of evaluating a silicon wafer, comprising:
a step of determining a concentration of thermal donors formed in the silicon wafer through heat treatment under a predetermined set of conditions using the method of predicting a behavior of thermal donors, according to claim 1; and
a step of determining a predicted resistivity of the silicon wafer having been subjected to heat treatment under the predetermined set of conditions based on the thermal donor concentration.

7. A method of producing a silicon wafer comprising:
a step of ascertaining a set of heat treatment conditions in a device process performed on the silicon wafer;
a step of determining a predicted resistivity of the silicon wafer having been subjected to heat treatment under the set of heat treatment conditions for the device process using the method of evaluating a silicon wafer, according to claim 6; and
a step of designing a target value of either an oxygen concentration or a resistivity of the silicon wafer before being subjected to the device process, based on the predicted resistivity.

* * * * *

UNITED STATES PATENT AND TRADEMARK OFFICE
CERTIFICATE OF CORRECTION

PATENT NO. : 11,121,003 B2  
APPLICATION NO. : 16/621219  
DATED : September 14, 2021  
INVENTOR(S) : K. Torigoe et al.

Page 1 of 1

It is certified that error appears in the above-identified patent and that said Letters Patent is hereby corrected as shown below:

In the Claims

| Column | Line | |
|---|---|---|
| 18 | 17 | change "T[K]" to -- T$\geq$723 [K] -- |

Signed and Sealed this  
Fifteenth Day of February, 2022

Drew Hirshfeld  
*Performing the Functions and Duties of the  
Under Secretary of Commerce for Intellectual Property and  
Director of the United States Patent and Trademark Office*